(12) United States Patent
Huang

(10) Patent No.: US 7,088,623 B2
(45) Date of Patent: Aug. 8, 2006

(54) NON-VOLATILE MEMORY TECHNOLOGY SUITABLE FOR FLASH AND BYTE OPERATION APPLICATION

(75) Inventor: Chih-Jen Huang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 14 days.

(21) Appl. No.: 10/685,496

(22) Filed: Oct. 16, 2003

(65) Prior Publication Data

US 2005/0083738 A1    Apr. 21, 2005

(51) Int. Cl.
 *G11C 16/04*  (2006.01)
(52) U.S. Cl. .......................... 365/185.29; 365/185.18; 365/185.24; 365/185.26
(58) Field of Classification Search .......... 365/185.29, 365/185.28, 185.24, 185.26, 185.18
See application file for complete search history.

(56) References Cited

U.S. PATENT DOCUMENTS

| | | | | |
|---|---|---|---|---|
| 5,455,793 A | * | 10/1995 | Amin et al. ........... | 365/185.26 |
| 5,793,678 A | * | 8/1998 | Kato et al. ............. | 365/185.27 |
| 5,818,761 A | * | 10/1998 | Onakado et al. ....... | 365/185.18 |
| 5,901,084 A | * | 5/1999 | Ohnakado .............. | 365/185.24 |
| 5,978,264 A | * | 11/1999 | Onakado et al. ....... | 365/185.29 |
| 6,556,481 B1 | * | 4/2003 | Hsu et al. .............. | 365/185.24 |
| 6,731,544 B1 | * | 5/2004 | Han et al. .............. | 365/185.28 |

* cited by examiner

*Primary Examiner*—Huan Hoang
(74) *Attorney, Agent, or Firm*—Arent Fox, PLLC.

(57) ABSTRACT

The present invention provides a non-volatile memory cell structure suitable for the flash memory cell and EEPROM cell (electrically erasable programmable read only memory cell) to perform the byte programming and byte erasing operations. In the programming operation, a higher negative voltage applied to the drain region, such that the hot holes is generated to induce the hot electrons into the floating gate through the tunneling oxide layer in the lateral electrical field. In addition, the gate voltage is around the threshold voltage, which dependent on the integration circuit device design. Furthermore, the non-volatile memory cell utilized the channel Fowler-Nordheim tunneling for erasing operation. In order to perform the byte erasing operation, the drain junction used as an inhibition switch. Thus, the unselected cell in the same word line is inhibited by biasing the drain to ground. Therefore, the word lines of unselected cells are grounded.

9 Claims, 2 Drawing Sheets

NON-VOLATILE MEMORY TECHNOLOGY SUITABLE FOR FLASH AND BYTE OPERATION APPLICATION

BACKGROUND OF THE INVENTION

1. Field of the Invention

The present invention generally relates to a non-volatile memory cell with its operations, and more particularly to a non-volatile memory cell suitable for flash and byte operation application.

2. Description of the Prior Art

Semiconductor based memory devices largely comprises Random Access Memories (RAM) and Read Only Memory (ROM). RAM is referred to as volatile memory, in that when supply voltage is removed, data is destroyed with the passage of time. ROM devices, including Programmable ROM (PROM), Erasable PROM (EPROM), and Electrically EPROM (EEPROM). Numerous EEPROM cells and flash memory cells can be simultaneously erased, and are characterized by a stacked gate structure comprising a floating gate and a control gate.

The conventional P-channel stacked gate flash cell programming operation is utilized the channel hot hole induces the hot electron to put the electron into the floating gate. Furthermore, erasing operation is utilized FN (Fowler-Nordheim) tunneling through the tunneling oxide by FN tunneling to pull out the electron from the floating gate to the substrate. Accordingly, the programming operation is byte operation but the erasing operation is not.

FIG. 1 shows a conventional EEPROM cell 100 in which more than two binary states may be represented by programming cell 100's threshold voltage to one of many predetermined levels. When the EEPROM cell 100 is read, the current level conducted therein is dependent upon the threshold voltage thereof.

EEPROM cell 100 includes a storage transistor 104 and a select transistor 106 that are formed in a P-type substrate 102. N+ diffusion region 108 serves as the source of storage transistor 104. N+ diffusion region 110 serves as the drain of the storage transistor 104 as well as the source for select transistor 106, and N+ diffusion 112 serves as the drain of select transistor 106. A bit line, BL, of an associated memory array (not shown in FIG. 1) is coupled to the drain 112 of select transistor 106. A high impedance resistor 122 is coupled between the drain 112 of select transistors 106 and ground potential. Storage transistor 104 has an interpoly dielectric layer 118 between the floating gate 116 and a control gate 120, and a select transistor 106 has a select gate 122. A tunneling window is formed within the tunneling oxide layer 114 of facilitate electron high voltage between floating gate 116 and the drain 110.

Floating gate 116 is charged by applying an erase voltage $V_E$ between 16 through 20 volts to the control gate 120, applying 16 through 20 volts to the select gate 122, and applying 0 volt to the bit line, and source region 108 is floating. Electrons of the tunneling oxide layer float from the drain region 110 to the floating gate 116, thereby the threshold voltage $V_t$ of the storage transistor 104 can be increased.

The EEPROM cell 100 may be programmed by applying a program voltage $V_{pp}$ between 13–20 volts to the bit line and the select gate 122 while the control gate 120 is grounding, and the source region 108 is in a high impedance state. The resultant electrical field causes the electrons of the tunneling oxide layer that floats from the floating gate 116 to the drain region 112, thereby the floating gate 116 is discharged, and the threshold voltage $V_t$ of the EEPROM cell 100 is decreased. Thus, the current is conducted by the EEPROM cell 100 during a read operation that may be controlled by adjusting the program voltage $V_{pp}$.

Erase take place electrically by F-N tunneling of electrons from the floating gate to the source (source erase) to the channel region (channel erase). During the electrical erasing operation, an field oxide layer on the order of 10 MV/cm is generated across the thin oxide between the floating gate and the n+ source diffusion (or the channel). This is accomplished by the three types erasing methods. The extent of cell erasure is controlled by circuitry, and is done algorithmically by using a series of erasing and erasing verifies operation. Each erase pulse is typically 10 ms in length and is followed by a verification of the erased threshold by sensing the cell current.

One of the erasing methods is grounded gate source erase that is accomplished by biasing the source region at a high potential, which is about 12V, and the control gate and the substrate are grounded. The drain node is allowed to float. This causes electrons of tunneling oxide layer floats from the floating gate to the source region, which discharges or "erase" the floating gate. Under the grounded gate source erase conditions, the source bias generates significant band-to-band tunneling current, which is collected in the substrate. Because the source junction is biased near the avalanche regime, there is some multiplication of the band-to-band current. These current acts as a voltage clamp, thereby the junction voltage is limited to increase due to a voltage drop in the on-chip pass transistors. If the substrate current is sufficiently high, the hot holes are generated by the breakdown that may start to erase the memory cell. The hot holes erasing process is difficult to controls, and is avoided in well-designed memory cell.

Additionally, some holes are generated by band-to-band tunneling are trapped in the gate oxide. This may lead to erase threshold non-uniformity, speed-up of erase time with cycling, degradation of charge retention, or speed-up of gate disturb. Balanced against these negative points is the simplicity of the memory cell structure, which has led to considerable efforts to engineer junction in order to minimize the effects.

Another erase method is negative gate source erase, which is accomplished by biasing the source node at $V_{cc}$ (5V) and applying approximately −10V to the control gate. In the grounded gate approach, the electrons of tunneling oxide layer float from the floating gate to the source diffusion. As a result, the memory cell is erased. The band-to-band tunneling generated holes, however, there are not heated as much as in the grounded gate case because of reduced lateral electrical field between the source region and the substrate (only 5 V at the source junction). Thus, the adverse effects from the holes are generated from the band-to-band tunneling that may be reduced. Offsetting the expected improvement in erasing performance is the additional circuit complexity that is required for the switching both positive and negative voltages by the word-line driver circuit.

Typical operation will have floating gate charged positively with respect to ground when eased and charged negatively with respect to ground when programmed. To read the memory transistor, the control gate is grounded and the gate of select transistor is biased positive voltage to provide a low resistance path from its drain contact to the drain of the memory transistor. The drain contact provides the connection to the metal bit line. The bit line is biased at a modest positive voltage (e.g. 2 volts) and the common source line is biased at ground. If the floating gate is erased, the current can flow from the bit line to the source region. If the floating gate is programmed, the memory transistor is in a non-conducting states, and there are no current flows. The presence or absence of current flow is sensed to determine the state stored by memory transistor.

The oxide in the tunnel window is typically about 10 nm thick. To program memory cell, the floating gate must be coupled to a sufficiently positive potential with respect to the drain region is of about 10 MV/cm that appears across the tunnel oxide. This is accomplished by biasing control gate at about 20 volts while biasing the select gate at a sufficiently high potential such that the select transistor is conducting with the bit line at ground potential. Under these conditions, the drain region provides a source of electrons on the cathode side of the tunneling oxide layer. With 10 MV/cm appearing across tunneling oxide layer, fowler-Nordheim tunneling occurs and charges the floating gate negatively.

To erase memory transistor, the bias across tunnel oxide must be reversed. This is accomplished by applying a high bias to drain of memory transistor while poly 2 control gate biased at ground in order to keep control gate capacitive coupled to a low voltage. The high voltage is applied to drain memory transistor by applying the desired voltage to bit line while gate of select transistor is biased at a potential that is higher than the desired voltage by at least the threshold voltage of select transistor.

SUMMARY OF THE INVENTION

It is one object of the present invention to provide a cell structure, which can compatibly for flash memory cell and EEPROM cell (electrically erasable programmable reads only memory) applications to reduce the die size.

It is another object of the present invention to combine the flash memory cell and EEPROM cell (electrically erasable programmable read only memory) in a cell structure to perform the byte program and byte erase operation.

It is yet object of the present invention to provide a cell structure with a single transistor to perform the byte operation, so as to reduce the process complexity and decrease the cost effectively.

According to aforementioned objects, the present invention provides a non-volatile memory technology structure suitable for the flash memory cell and EEPROM cell (electrically erasable programmable read only memory cell) to perform the byte programming and byte erase operation. The cell structure comprises a gate stack over the substrate and the isolation structure therein. The gate stack comprises a floating gate on the substrate and an interpoly dielectric layer (IPD) between the floating gate and the control gate. The channel region below the field oxide region and the LDD region (lightly drain doped) below the field oxide region within the substrate. The spacer on the sidewall of the gate stack and a source/drain region below the tunneling oxide layer and adjacent to the LDD region.

During the programming operation, a negative voltage applied to the drain region, such that the hot hole is generated to induce the hot electron into the floating gate through the tunneling oxide layer. In addition, the gate voltage is around the threshold voltage $V_t$, which dependent on the integration circuit device design.

In addition, the non-volatile memory cell utilized the channel Fowler-Nordheim tunneling for erase operation. In order to perform the byte erase operation, the drain junction used as an inhibition switch. Thus, the unselected cell in the same word line is inhibited by biasing the drain to ground. Therefore, the word lines of unselected cells are ground.

Other objects, the advantages and silent features of the invention will become apparent from the following detailed description taken in conjunction with the annexed drawings, which disclosed preferred embodiments of the invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

The present invention provides a P-channel non-volatile memory cell that is invented to fit both the byte operation and flash operation in the same chip for the system on chip (SOC) era. Therefore, the present invention provides a flash memory cell that only utilized one transistor to perform the byte operation by using P-channel non-volatile memory cell so as to the size of the memory cell can be reduced, the complex process can be simplified, and the cost can be greatly decreased.

Figure 1:
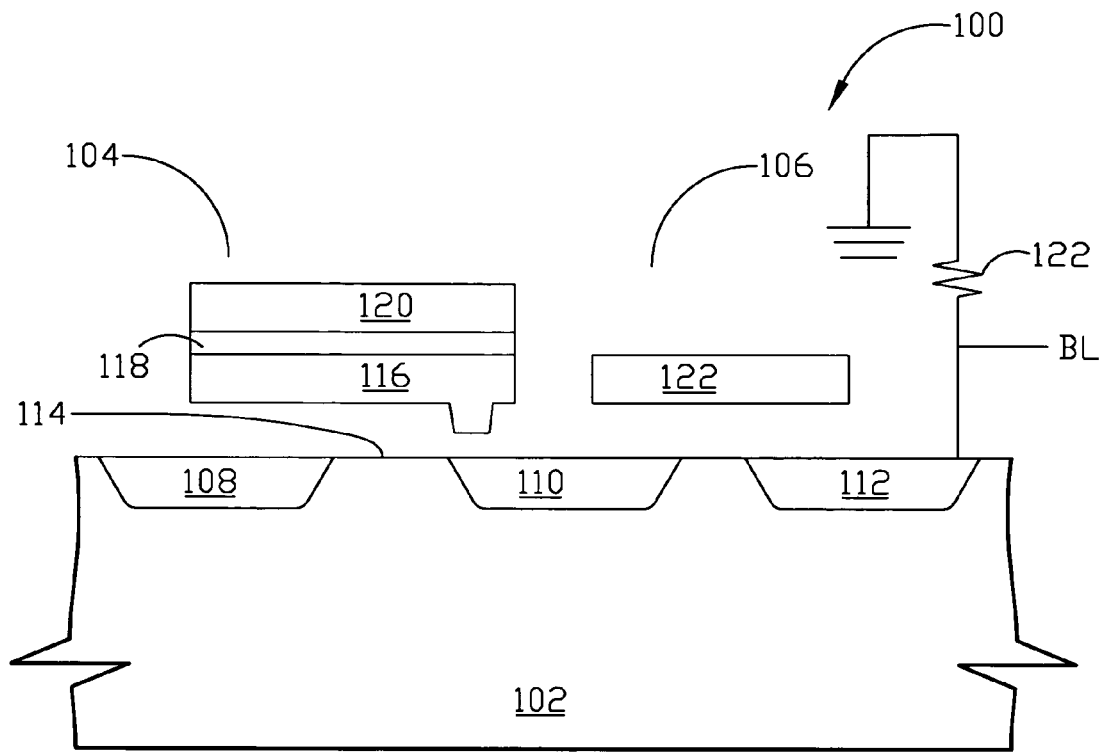
FIG. 1 is a cross-sectional view of EEPROM cell (electrically erasable programmable read only memory cell) utilized programming and erasing operation to one of many levels of threshold voltage using conventional, prior art technique.
Figure 2:
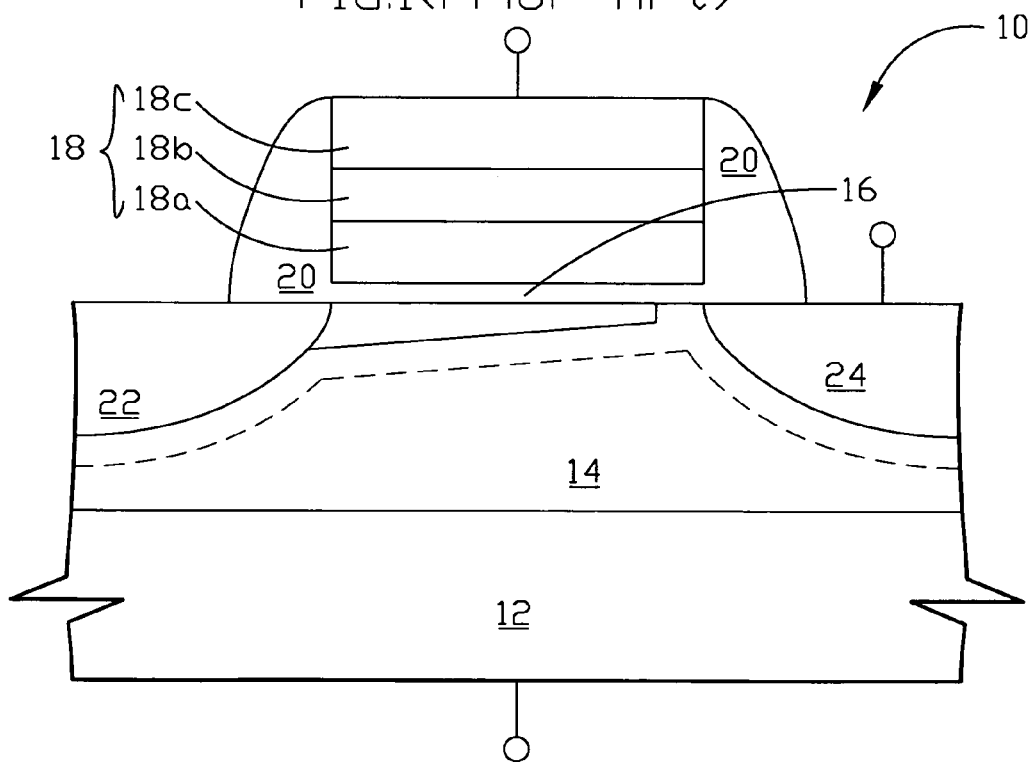
FIG. 2 is a cross-sectional view of the non-volatile memory cell structure with one transistor that suitable byte programming and byte erase operations in accordance with a structure disclosed herein.

Referring to FIG. 2, the present invention provides a flash memory cell 10 with one transistor, which includes a P-type substrate 12 and an N-type well region 14 formed therein, wherein the conductivity of the P-type is opposite to the conductivity of N-type. A P-channel MOS (metal-oxide-semiconductor) stacked gate storage transistor 18 is formed on the P-substrate 12. A drain region 24 of P-type conductivity of the P-channel MOS stacked gate storage transistor 18 is formed in the N-type well region 14. Similarly, a source region 22 of P-type conductivity of the P-channel MOS stacked gate storage transistor 18 is formed in the N-type well region 14, which spaced apart from the drain region 24. In additional, the source region 22 is spaced apart by the isolation structure (not shown in FIG. 2) such that the source voltage can be controlled respectively, wherein the isolation structure can be LOGOS (field oxide region) or STI (shallow trench isolation) (not shown in FIG. 2).

The P-channel MOS stacked gate storage transistor 18 has a floating gate 18a, typically made of polysilicon, which is positioned over the tunneling oxide layer 16. The floating gate 18a of the P-channel MOS stacked gate storage transistor 18 is spaced apart from the source region 22. A control gate 18c is positioned above the floating gate 18a. In addition, a first insulator layer as the tunneling oxide layer 16 is disposed between the floating gate 18a and the N-type well region 14, and a second insulator layer as an interpoly dielectric (IPD) layer 18b is disposed between the floating gate 18a and the control gate 18c, wherein the material of the IPD layer 18b can be an ONO layer (oxide/nitride/oxide).

In order to perform the byte programming and byte erasing operations in the non-volatile memory cell, the preferred embodiment of the present invention provides a memory cell structure with one transistor to reduce the size of the memory cell structure and the performance would be enhanced. In addition, the programming operation utilized the channel hot holes to induce the hot electrons injection and the erasing operation utilized the F-N (Fowler-Nordheim) tunneling. Thus, either the programming or erasing operations having low voltage, the programming or erasing operations has the lower power consumption.

Figure 3:
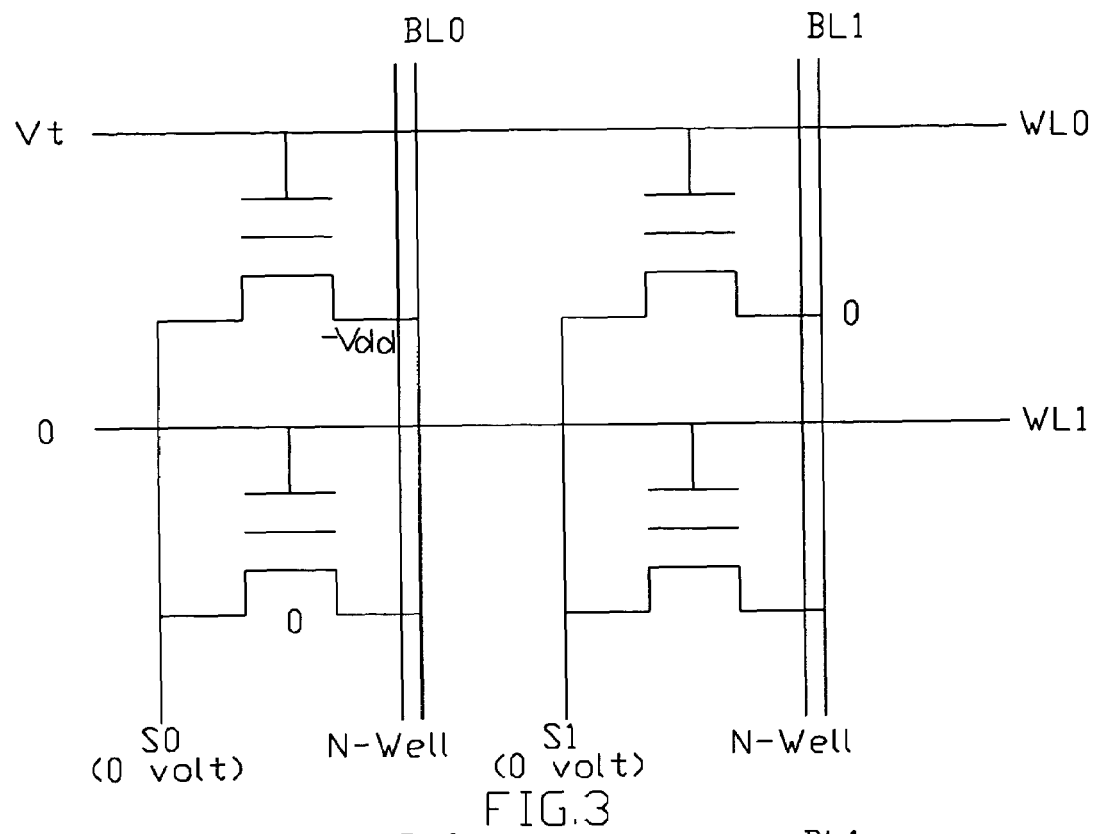
FIG. 3 is a top view of the non-volatile memory cell array to illustrate the programming operation in accordance with the structure disclosed herein.

As shown in FIG. 3, the programming operation for the non-volatile memory cell with one transistor is similar to the programming operation of the conventional flash memory cell. The non-volatile memory cell is programmed by applying a negative voltage around −4 to −6 volts to the drain region to induce hot electrons wherein the hot electrons with higher energy, and in the channel region near the drain region. The hot electrons accelerate across the tunneling oxide layer and into the floating gate. The hot electrons are float into the floating gate, which is surrounded by an insulator layer. A gate is a "floating gate" when it is located between a control gate and the N-type well region, and is not connected to word line, bit line, or other line. The insulator layer can include the interpoly dielectric layer and the tunneling oxide layer. The floating gate would increase the threshold voltage $V_t$ of the non-volatile memory cell. The non-volatile memory cell is programmed by this change in the threshold voltage $V_t$, and the channel conductance of the non-volatile memory cell is created by the floating gate. The floating gate can hold the charge almost indefinitely, even after the power is turned off to the memory cell.

During the programming operation, the negative drain voltage $V_{dd}$ is applied to the drain regions, and the gate voltage $V_g$ is around the threshold voltage $V_t$ that dependent on the design, wherein the threshold voltage $V_t$ in the preferred embodiment is around −4 volts. Due to the drain voltage $V_{dd}$ is higher than the threshold voltage $V_t$ to induce the hot electrons injection from channel region through the tunneling oxide layer into the floating gate, such that the electrons are hold in the floating gate. Furthermore, the bias would only allow a sub-threshold current flow in the flash memory cell during the programming operation. Thus, the injection efficiency is high for this flash memory cell and the power consumption of the integration circuit device would be lowered.

On the other hand, the word line 0 of the unselected cell devices are applied a threshold voltage $V_t$ and word line 1 of the unselected cell devices are grounded (0 volt) in the memory cell array. The bit line 0 is applied a negative drain voltage $V_{dd}$ and the bit line 1 is grounded.

In addition, in order to avoid the distribution during the programming operation, the word line 1 is grounded and the voltage of the word line 0 is approached the negative threshold voltage, $V_g=-V_t$, but the bit line 1 is grounded, such that the transistor exhibits turn off state. Because there is no lateral electrical field to generate the hot electrons, thus, the hot electrons are not generated. Thus, there is no programming operation occurred. Thus, the state of the gate transistor is turned off when the threshold voltage $V_t$ is applied to the word line 0 which is higher than the dram voltage $V_{dd}$.

Figure 4:
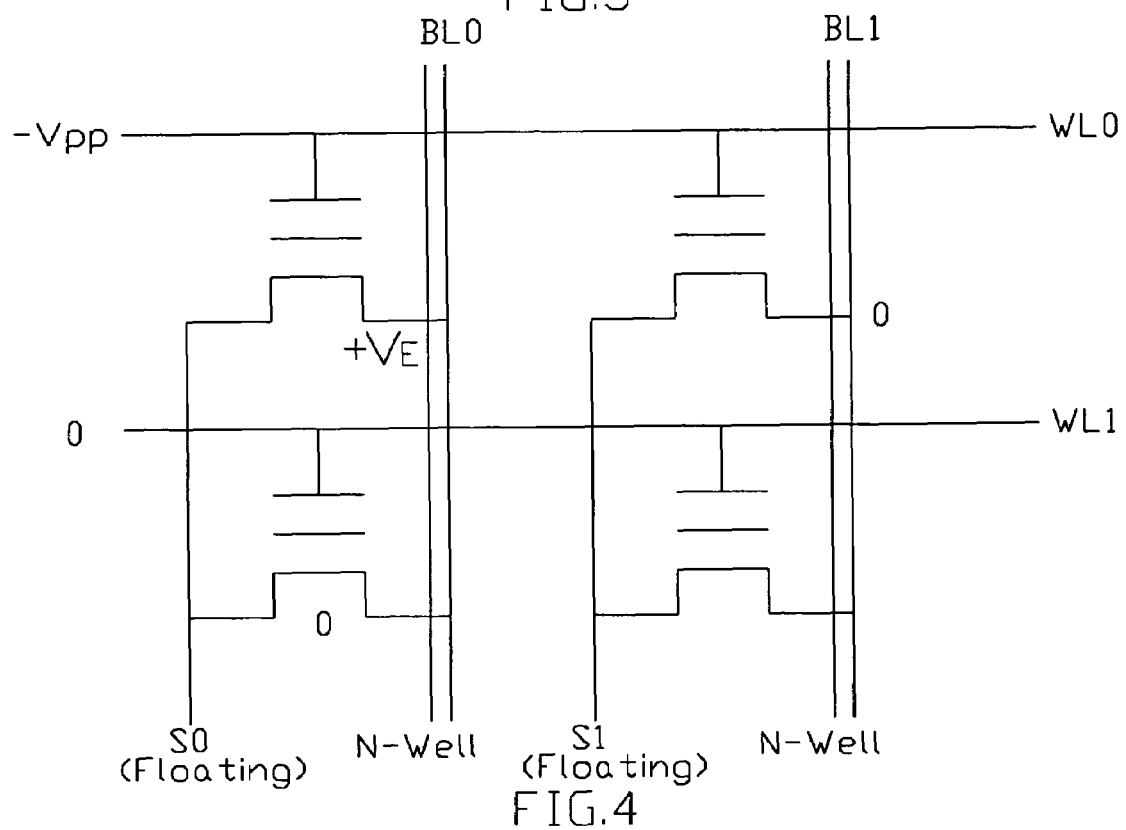
FIG. 4 is a top view of the non-volatile memory cell array to illustrate the erase operation in accordance with the structure disclosed herein.

Referring to FIG. 4, the preferred embodiment of the present invention provides the flash memory cell is erased by channel Fowler-Nordheim (FN) tunneling. In order to perform the byte erasing operation, the erase voltage $V_E$ is applied to the bit line 0, and the N-type well region and the bit line 1 are grounded, the word line 0 is applied a negative voltage, $V_{pp}$, and the word line 1 is grounded as well as the bit line 1. Therefore, the source voltage exhibits floating, and the erase voltage $V_E$ is applied to N-type well region. The high electrical field from biases of $+V_{pp}$ and $-V_E$ would be pulled the electrons of floating gate to N-type well region by F-N tunneling.

For the P-channel flash memory cell, the control gate voltage $V_{CG}$ is higher (less negative) while the electrons are hold in the floating gate, in contrast, the control gate voltage $V_{CG}$ is decreased (more negative) when the electrons are pulled out from the floating gate through the tunneling oxide layer into the N-type well region.

If the control gate voltage $V_{CG}$ is higher than the threshold voltage $V_t$, the P-channel flash transistor would be "turned on" to perform the erasing operation. On the other hand, the channel is increased over the surface of the N-type well region when the voltage is applied to the gate to let the PMOS turn on. If the bit line bias is positive $V_E$, the high electrical field electron control gate $(-V_{pp})$ and channel region $(+V_E)$ would pull the electrons from the floating gate to channel via F-N tunneling through the tunneling oxide layer. If the bit line bias is grounded, the electrical field between the control gate (−Vor grounded) and the channel region (grounded) is not enough to assist FN-tunneling to pull out the electrons from the floating gate. So it would achieve byte erasing operation by selecting the WL and BL bias.

Furthermore, the source lines (source line 0 and source line 1) along the bit line direction is divided by the isolation structure, which comprises the isolation structure to block the leakage current between the different cells on the same word lines. In order to release the constraint of high voltage in the periphery devices, the negative voltage is applied to the gate, and the positive voltage is applied to the drain region and n-type well region. Thus, the thinner gate oxide layer and lower $V_{BDSS}$ can be sustained this non-volatile higher operating voltage operation to simply the process and reduce the cost.

According to aforementioned descriptions, the advantages of the present invention as following: firstly, the non-volatile memory cell only utilized one transistor to perform the byte programming operation and the byte erasing operation, such that the device area can be diminished to shrink the integration circuit size. It could be served flash memory cell and EEPROM applications with one transistor technology.

Secondly, the operating voltage is smaller than the EEPROM or conventional flash memory cell such that the cost and the power cosumption can be reduced. It is also simply the frabrication process.

Thirdly, during the erasing operation, the channel potential is depended on the state of the bit line to let the electrical field of the transistor is not enough to perform the erasing operation to pull down to the N-type well region from the floating gate, or inhibit the erasing operation to reduce the electrical field.

Although specific embodiments have been illustrated and described, it will be obvious to those skilled in the art that various modifications may be made without departing from what is intended to be limited solely by the appended claims.

What is claimed is:

1. A non-volatile memory cell structure, said non-volatile memory cell structure comprising:
   an N-type well region in a substrate, a channel region between a P-type source region and a P-type drain region, wherein the conductivity type of said P-type is opposite to the conductivity type of said N-type;
   a first insulator layer on the surface of said N-type well region;
   a floating gate overlying said first insulator layer;
   a second insulator layer on said floating gate; and
   a control gate on said second insulator layer, wherein said non-volatile memory cell is erased by applying an erase voltage to said P-type drain region, a supply voltage to said control gate, and said erase voltage to said N-type well region,
   wherein a bit line bias of said non-volatile memory cell is positive, and said supply voltage is applied to said control gate that is higher than a threshold voltage of said non-volatile memory cell to perform an erasing operation.

2. The non-volatile memory cell structure according to claim 1, further comprising a source line coupled to said P-type source region, said source line exhibits floating.

3. The non-volatile memory cell structure according to claim 2, wherein said source line is divided by an isolation structure along a bit line direction.

4. A semiconductor memory cell structure, said semiconductor memory cell structure comprising:
   an N-type well region in a substrate, a channel region between a P-type drain region and a P-type source region, wherein the conductivity type of said N-type is opposite to the conductivity type of said P-type;
   an insulator layer overlying said N-type well region; and
   a gate transistor on said insulator layer, said gate transistor comprises a control gate coupled to a word line, said P-type drain region coupled to a bit line, wherein said cell is erased by applying an erase voltage to said N-type well region, and applying a supply voltage to said control gate,
   wherein a bit line bias of said non-volatile memory cell is positive, and said supply voltage is applied to said control gate that is higher than a threshold voltage of said non-volatile memory cell to perform an erasing operation.

5. The semiconductor memory cell structure according to claim 4, wherein said P-type source region is coupled to a source line.

6. The semiconductor memory cell structure according to claim 5, wherein said source line is divided by an isolation structure along a bit line direction.

7. The semiconductor memory cell structure according to claim 4, wherein said supply voltage applied to said control gate is erase voltage.

8. The semiconductor memory cell structure according to claim 4, wherein said cell is programmed by applying a negative supply voltage around −4 to −6 volts to said P-type drain region to induce hot electrons, and a negative threshold voltage is of about −4 volts applied to said word line.

9. A method for erasing non-volatile memory cell with a threshold voltage having a P-type substrate and an N-type well region therein, a channel region between a P-type drain region and a P-type source region, said method comprising the steps of:
   applying an erase voltage to said P-type drain region to cause tunneling oxide layer of electrons floats from a floating gate to said N-type well region, wherein said P-type drain region coupled to a bit line;
   applying a supply voltage to a control gate, wherein said control gate coupled to a word line; and
   grounding said word line of unselected cell and said bit line of unselected cell to cause said P-type drain region as an inhibit switch
   wherein a bit line bias is positive and said supply voltage is applied to said control gate that is higher than said threshold voltage of said non-volatile memory cell to perform said erasing non-volatile memory cell.

* * * * *